(12) United States Patent
Strabley et al.

(10) Patent No.: US 9,491,802 B2
(45) Date of Patent: Nov. 8, 2016

(54) ON-CHIP ALKALI DISPENSER

(71) Applicant: Honeywell International Inc., Morristown, CA (US)

(72) Inventors: Jennifer S. Strabley, Maple Grove, MN (US); Karl D. Nelson, Plymouth, MN (US); Robert Compton, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 718 days.

(21) Appl. No.: 13/764,187

(22) Filed: Feb. 11, 2013

(65) Prior Publication Data

US 2013/0213940 A1    Aug. 22, 2013

Related U.S. Application Data

(60) Provisional application No. 61/600,283, filed on Feb. 17, 2012.

(51) Int. Cl.
*H05B 1/00* (2006.01)
*C23C 14/26* (2006.01)
*C22B 26/10* (2006.01)
*C23C 14/16* (2006.01)
*G04F 5/14* (2006.01)

(52) U.S. Cl.
CPC .............. *H05B 1/00* (2013.01); *C22B 26/10* (2013.01); *C23C 14/16* (2013.01); *G04F 5/14* (2013.01)

(58) Field of Classification Search
CPC ..... C22B 26/10; C23C 14/26; C23C 14/243; C23C 14/24
See application file for complete search history.

(56) References Cited

U.S. PATENT DOCUMENTS

| | | | | |
|---|---|---|---|---|
| 4,195,891 A | * | 4/1980 | Hellier | C23C 14/243 252/512 |
| 6,753,648 B2 | * | 6/2004 | Boffito | C23C 14/06 313/550 |
| 7,462,506 B2 | * | 12/2008 | Kuczynski | H01L 23/26 257/682 |
| 7,808,091 B2 | | 10/2010 | Amiotti | |
| 2003/0047817 A1 | * | 3/2003 | Kim | C23C 14/243 257/797 |
| 2003/0049025 A1 | * | 3/2003 | Neumann | A01M 1/2077 392/390 |
| 2004/0001916 A1 | * | 1/2004 | Boffito | C23C 14/06 427/248.1 |

(Continued)

FOREIGN PATENT DOCUMENTS

WO    2004065289    8/2004

OTHER PUBLICATIONS

Bhatnagar et al., "Comparison of 6H-SiC, 3C-SiC, and Si for Power Devices", Mar. 1993, IEEE Transactions on Electron Devices, vol. 40, No. 3, pp. 645-655.*

(Continued)

*Primary Examiner* — Geoffrey S Evans
(74) *Attorney, Agent, or Firm* — Fogg & Powers LLC

(57) ABSTRACT

Embodiments described herein provide for an on-chip alkali dispenser. The on-chip alkali dispenser includes a monolithic semiconductor substrate defining a trench therein, and an evaporable metal material disposed in the trench. A heating element is disposed proximate the evaporable metal material and configured to provide heat to the evaporable metal material. A getter material is disposed to sorb unwanted materials released from the evaporable metal material.

17 Claims, 2 Drawing Sheets

(56) References Cited

U.S. PATENT DOCUMENTS

Figure 1:
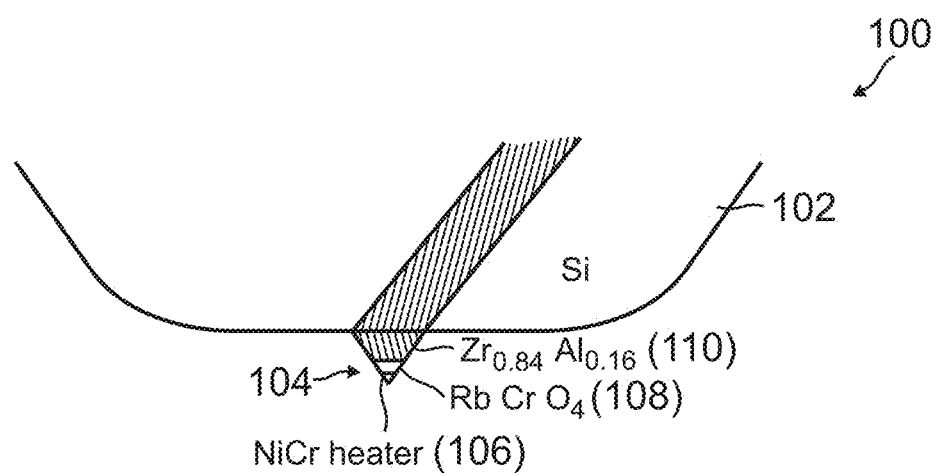

| | | | |
|---|---|---|---|
| 2004/0206205 A1* | 10/2004 | Boffito | C23C 14/06 75/591 |
| 2004/0213975 A1* | 10/2004 | Scott | C22C 47/00 428/292.1 |
| 2006/0152154 A1* | 7/2006 | Sugiyama | C22B 5/04 313/527 |
| 2006/0257296 A1 | 11/2006 | Lipp | |
| 2008/0236496 A1* | 10/2008 | Noguchi | C23C 14/044 118/726 |
| 2009/0025885 A1* | 1/2009 | Buschbeck | C23C 14/12 159/31 |
| 2010/0104450 A1* | 4/2010 | Longoni | H01J 7/20 417/48 |
| 2011/0247942 A1* | 10/2011 | Bernstein | C22B 26/10 205/560 |
| 2012/0006809 A1* | 1/2012 | Kobyakov | C04B 35/653 219/542 |

OTHER PUBLICATIONS

Dong et al., "An Enriched K Source for Atomic Cooling", Oct. 12, 2006, pp. 679-682, vol. 24, No. 3.

Liew et al., "Microfabricated alkali atom vapor cells", "Applied Physics Letters", Apr. 5, 2004, pp. 2694-2696, vol. 84, No. 14, Publisher: American Institute of Physics.

"Alkali Metal Dispensers", Feb. 2007, pp. 1-11, Publisher: SAES Getters Group, Published in: IT.

* cited by examiner

ON-CHIP ALKALI DISPENSER

CROSS-REFERENCE TO RELATED APPLICATIONS

This application claims the benefit of U.S. Provisional Application No. 61/600,283, filed on Feb. 17, 2012, which is incorporated herein by reference in its entirety.

BACKGROUND

There is much interest in miniaturizing devices using cold atoms for applications in precision timekeeping (e.g., atomic clocks), navigation (e.g., inertial sensors), and magnetic sensing. The cold atoms for these devices are used in a vaporized form, and may need to be replenished over time. Replenishing the atoms can be accomplished with a solid source material, which is referred to herein as an evaporable metal material, since the cold atoms comprise metal atoms, often an alkali. A component that includes such an evaporable metal material configured to release metal atoms is referred to herein as an alkali dispenser. An alkali dispenser can be configured to heat the evaporable metal material in order to release the metal atoms therefrom to create the metal atom vapor. Depending on the application, these vaporized atoms can then be cooled and trapped using light and magnetic fields.

There are two types of alkali sources in conventional atomic sensors: active and passive. A conventional passive source can be made small (~mm size) and are fabricated individually. That is, such passive sources are not compatible with batch fabrication processes and can have a lot of variability from sample to sample. It can be difficult to precisely regulate the atomic vapor pressure over temperature when using such sources as most atomic vapor pressures have very large temperature dependency. Often a second agent is needed to either passively or actively try to control the alkali density from the passive source. Unless made reversible, this is a lifetime limiter.

A conventional active source is typically an alkali dispenser or getter. An active source also can be small (~mm, pill size), but the required mounting and through-vacuum feeds make the assembly quite large. Such active sources also require large current to activate. The mounting size typically increases the distance from the source to the sensor head (where the sensing takes place), increasing the sensor size and decreasing the efficiency and lifetime of the source.

SUMMARY

Embodiments described herein provide for an on-chip alkali dispenser. The on-chip alkali dispenser includes a monolithic semiconductor substrate defining a trench therein, and an evaporable metal material disposed in the trench. A heating element is disposed proximate the evaporable metal material and configured to provide heat to the evaporable metal material. A getter material is disposed to sorb unwanted materials released from the evaporable metal material.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 1 is a cut-away perspective view of one embodiment of an on-chip alkali dispenser.

Figure 2A:
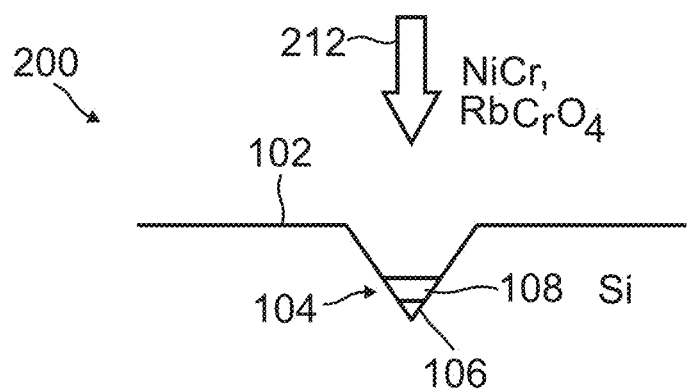
Figure 2B:
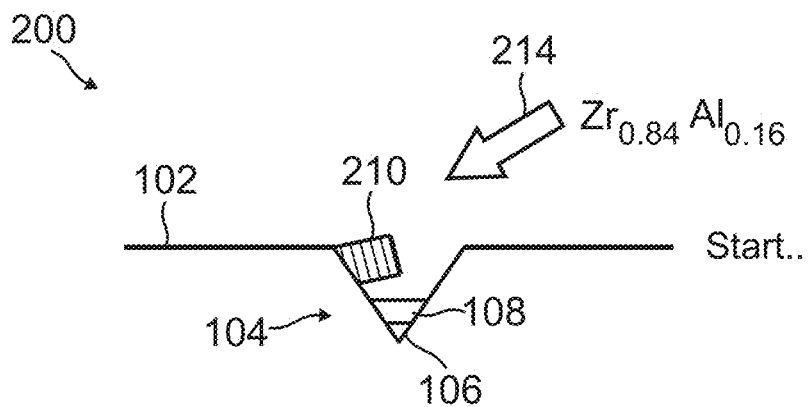
Figure 2C:
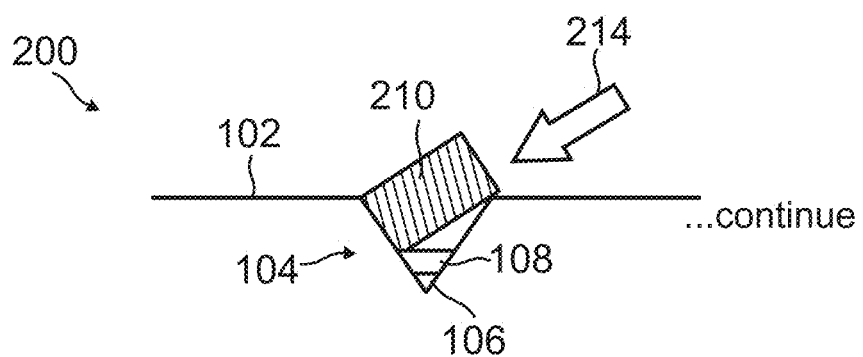

FIGS. 2A, 2B, and 2C are cross-sectional views illustrating examples of a substrate during the fabrication of another embodiment of an on-chip alkali dispenser.

In accordance with common practice, the various described features are not drawn to scale but are drawn to emphasize specific features relevant to the exemplary embodiments.

DETAILED DESCRIPTION

Embodiments described herein relate to an alkali dispenser having a reduced size. In particular, such embodiments relate to an alkali dispenser that is disposed on a monolithic semiconductor substrate. Such an alkali dispenser can enable heterogeneous integration of the alkali dispenser with other components on a single chip. Such an alkali dispenser can be disposed close to a cold atom sensor allowing for efficient use, longer lifetime, greater miniaturization, as well as lower currents and power consumption for a host device.

FIG. 1 is a cut-away perspective view of one embodiment of an on-chip alkali dispenser 100. The alkali dispenser 100 includes a substrate 102 defining a trench 104 in a working surface therein. The substrate 102 is composed of a monolithic semiconductor, such as silicon or germanium. The trench 104 can be formed by etching the working surface of the substrate 102 using semiconductor processing techniques. In the example shown in FIG. 1, the trench 104 has a V shaped cross-section, however, in other examples, the cross-section of the trench can be U shaped, rectangular, or irregularly shaped. In any case the trench 104 comprises a depression in a surface of the substrate 102.

The alkali dispenser 100 also includes a heating element 106. In the example shown in FIG. 1, the heating element 106 is disposed in a bottom portion of the trench 104. In another example, the heating element 106 can be disposed on the backside of the substrate 102 (i.e., the surface reverse of the surface defining the trench 104) in a location proximate the trench 104, such that the heating element 106 can provide heat to the trench 104. Whether on the front side or the backside of the substrate 102, the heating element can be deposited on the substrate 102 using any suitable thin film deposition process.

The alkali dispenser 100 also includes an evaporable metal material 108 and a getter material 110 that are located all or partially within the trench 104. Whether in the trench 104 or on the backside of the substrate 102, the heating element 106 disposed proximate the evaporable metal material and configured to provide heat to the evaporable metal material 108 to enable release of the metal atoms therefrom. The heating element 106 comprises a thin film of an electrically conductive material, such as NiCr.

In some examples, an insulating layer can be disposed between the heating element 106 and adjacent materials. In examples where the heating element 106 is disposed within the trench 104, such an insulating layer can be disposed between the heating element 106 and the trench 104 and/or between the heating element 106 and the evaporable metal material 108. Such an insulating layer can be composed of an oxide, such as silicon dioxide. Such an insulating layer can be deposited using any suitable thin film deposition process. In examples where the heating element 106 is disposed in the trench 104, the evaporable metal material 108 can be disposed over the heating element 106 and on top of the insulating material layer, if present.

In an example, the heating element 106 is configured for resistive heating. As such, the electrically conductive material forming the heating element 106 can be continuous such that an electrical current can be passed therethrough. For resistive heating, the heating element 106 can be configured to be electrically coupled to an electrical source that provides electrical current for propagation through the heating element 106. The heating element 106 can be coupled to the electrical source through one or more wire bonds, through-wafer vias, or other suitable mechanism. For resistive heating, the heating element 106 functions to convert a portion of the electrical current passing therethrough into heat.

In another example, the heating element 106 is configured for inductive heating. For inductive heating, the heating element 106 can be configured to be coupled to a radio frequency (RF) tuned circuit (e.g., an inductor-capacitor circuit). The RF tuned circuit can be resonant with an RF power source such that an electromagnetic signal from the RF power source can induce eddy currents in the heating element 106. These eddy currents can raise the temperature of the heating element 106. Advantageously, use of a heating element 106 configured for inductive heating can eliminates the vacuum feed-throughs that are used to carry electrical power to a heating element 106 configured for resistive heating. Additionally, it enables the RF power source to be located outside of a vacuum chamber in which the alkali dispenser 100 is disposed.

In any case, the heating element 106 is configured to provide heat to the evaporable metal material 108. In operation, the magnitude of heat provided by the heating element 106 can be controlled by controlling the magnitude of current passing therethrough.

The evaporable metal material 108 can be disposed within the trench 104. As mentioned above, in examples where the heating element 106 is disposed within the trench 104, the evaporable metal material 108 can be disposed on a top surface of the heating element 106. The evaporable metal material 108 can be composed of any material configured to release an alkali or alkaline-earth metal, such an alkali salt. Example metals that can be released include beryllium, lithium, sodium, potassium, rubidium, cesium, magnesium, calcium, strontium, and barium. In an example, the evaporable metal material 108 is composed of RbCrO4. In examples where the heating element 106 is disposed within the trench 104, the evaporable metal material 108 can be in direct contact with a surface of the heating element 106 and can be disposed over all or only a portion of the surface of the heating element 106. During fabrication, the evaporable metal material 108 can be deposited in the trench 104 (e.g., on the exposed surface of the heating element 106) using any suitable thin film deposition process, such as sputtering, chemical vapor deposition, or evaporation The getter material 110 is disposed to sorb unwanted gases released from the evaporable metal material 108. The getter material 110 can be composed of a single metal, or a multi-metal composition. In the case of a single metal, this may be hafnium, niobium, vanadium, titanium, or zirconium. In the case of multi-metal materials, alloys based on titanium, and/or zirconium with at least another element chosen among the transition elements, Rare Earths, and aluminum can be used. Other compositions are also possible.

In the example shown in FIG. 1, the getter material 110 is disposed on a surface of the evaporable metal material 108. In such an example, the getter material 110 can be porous such that the vaporized metal atoms released from the evaporable metal material 108 can escape therethrough. In an implementation of such an example, the getter material 110 can be patterned on the exposed surface of the evaporable metal material 108 such that passages are provided through the getter material 110 to the evaporable metal material 108 underneath. During fabrication, such a getter material 110 can be a thin film that is deposited on the exposed surface of the evaporable metal material 108 using any suitable thin film deposition process, such as sputtering, chemical vapor deposition, or evaporation.

In another example, the getter material 110 can be a powder that is placed within the trench 104 on the exposed surface of the evaporable metal material 108. In this example, the trench 104 can contain the powder, which can enable the use of a non-evaporable getter material. A permeable membrane (e.g., a mesh) can be placed over the trench 104 to confine the powder therein.

FIGS. 2A, 2B, and 2C illustrate examples of a substrate 102 during fabrication of another embodiment of an alkali dispenser 200 where getter material 210 is disposed on a side surface (as compared to a bottom surface) of the trench 104 adjacent to the evaporable metal material 108. FIG. 2A illustrates the substrate 102 after depositing of the heating element 106 and evaporable metal material 108 in the bottom of the trench 104. The trench 104, heating element 106, and evaporable metal material 108 can be as described above with respect to FIG. 1. Arrow 212 illustrates the direction of deposition of the heating element 106 and evaporable metal material 108. As shown, the heating element 106 and evaporable metal material 108 can be deposited in a direction normal to the surface of the substrate 102.

FIG. 2B illustrates the substrate 102 during deposition of the getter material 210 on a side surface of the trench 104. As shown, the getter material 210 can be attached to a surface of the substrate 102 within the trench 104 (e.g., a side surface of the trench 104). As shown by arrow 214, the getter material 210 can be deposited at an angle with respect to the direction of deposition of the evaporable metal material 108, such that the getter material 210 is incident upon a side surface of the trench 104. Since in this example, the evaporable metal material 108 was deposited in a direction normal to the working surface of the substrate 102, the getter material 210 can be deposited at an acute angle with respect to the working surface of the substrate 102. The specific angles of deposition of the getter material 210, heating element 106, and evaporable metal material 108 can vary from that shown in FIGS. 2A and 2B as long as the getter material 210 is incident upon a surface of the substrate 102 within the trench 104. That is, the getter material 210 is not, for the most part, incident on the surface of the evaporable metal material 108. This enables the kinetic energy of the deposition process to be absorbed by the substrate 104 rather than the evaporable metal material 108. As shown in FIG. 2C, deposition of the getter material 210 can continue until the accumulated getter material 108 extends over top of the evaporable metal material 108. In this example, the getter material extends substantially across the trench 104. The getter material 210 can also be disposed such that the gases that are released by the evaporable metal material 108 pass through or by the getter material 210. The getter material 210 can be a thin film that is deposited using any suitable thin film deposition process, such as sputtering, chemical vapor deposition, or evaporation. Similar to the example of FIG. 1, in the examples of FIGS. 2A, 2B, and 2C, the getter material 210 can have non-continuities along its length such that the vaporized metal atoms released from the evaporable metal material 108 can escape therethrough.

In example where the heating element 106 and/or evaporable metal material 108 are disposed within the trench 104, the size of the trench 104, size of heating element 106, and amount of evaporable metal material 108 are selected such that the heating element 106 and evaporable metal material 108 are substantially contained within the cross-section of the trench 104. In some examples, the amount of getter material 110, 210 can also be taken into account to such that the getter material 110, 210, heating element 106 and evaporable metal material 108 are substantially contained within the cross-section of the trench 104.

Example Embodiments

Example 1 includes an on-chip alkali dispenser comprising: a monolithic semiconductor substrate defining a trench therein; an evaporable metal material disposed in the trench; a heating element disposed proximate the evaporable metal material and configured to provide heat to the evaporable metal material; and a getter material disposed to sorb unwanted materials released from the evaporable metal material.

Example 2 includes the on-chip alkali dispenser of Example 1, wherein the heating element is disposed one of in the trench under the evaporable metal material or on backside of the semiconductor substrate proximate the trench.

Example 3 includes the on-chip alkali dispenser of any of Examples 1 or 2, wherein the getter material is disposed within the trench and overtop of the evaporable metal material, wherein the getter material comprises a powder; and wherein the alkali dispenser comprises a permeable membrane over the getter material, enclosing the getter material within the trench.

Example 4 includes the on-chip alkali dispenser of any of Examples 1 or 2, wherein the getter material is disposed within the trench and overtop of the evaporable metal material, wherein the getter material comprises a porous thin film.

Example 5 includes the on-chip alkali dispenser of any of Examples 1 or 2, wherein the getter material is disposed within the trench and overtop of the evaporable metal material, wherein the getter material comprises a patterned thin film having a plurality of passages to allow gas from the evaporable metal material to permeate the getter material.

Example 6 includes the on-chip alkali dispenser of any of Examples 1-5, wherein the heating element is disposed in the trench, wherein the alkali dispenser comprises: an insulating layer disposed on top of the heating element; and wherein the evaporable metal material is disposed on top of the insulating layer.

Example 7 includes the on-chip alkali dispenser of any of Examples 1-6, wherein the getter material is disposed adjacent to the evaporable metal material on a side surface of the trench.

Example 8 includes the on-chip alkali dispenser of any of Examples 1-7, wherein the heating element is coupled to an electrical source and configured to heat by converting electrical current into heat.

Example 9 includes the on-chip alkali dispenser of any of Examples 1-8, wherein the heating element is coupled to a radio frequency tuned circuit and configured to heat by having electrical currents induced therein from a radio frequency signal.

Example 10 includes a method of fabricating an on-chip alkali dispenser, the method comprising: etching a top working surface of a substrate to form a trench; depositing a thin film of an evaporable metal material in the trench; depositing a thin film of an electrically conductive material such that the electrically conductive material will be proximate the evaporable metal material; and placing a getter material on the substrate proximate the evaporable metal material.

Example 11 includes the method of Example 10, wherein depositing a thin film of an electrically conductive material includes depositing a thin film of electrically conductive material in the trench; and depositing an insulating layer on top of the electrically conductive material; wherein depositing a thin film of an evaporable metal material includes depositing a thin film of evaporable metal material on top of insulating layer.

Example 12 includes the method of any of Examples 10 or 11, wherein depositing the getter material includes depositing the getter material overtop of the evaporable metal material and patterning the getter material to form a plurality of passages to allow gas from the evaporable metal material to permeate the getter material.

Example 13 includes the method of any of Examples 10-12, wherein placing the getter material includes placing a powdered getter material in the trench and overtop of the evaporable metal material; and wherein the method includes placing a permeable membrane over the trench to enclose the getter material within the trench.

Example 14 includes the method of any of Examples 10-13, wherein depositing a thin film of evaporable metal material includes depositing at the first angle; and wherein placing the getter material includes depositing the getter material at a second angle with respect to the top working surface, wherein the second angle is different than the first angle such that the getter material is incident on a surface of the substrate within the trench.

Example 15 includes the method of Example 14, wherein the first angle is substantially normal to the top working surface; and wherein the second angle is acute with respect to the top working surface such that the surface of the substrate is a side surface of the trench.

Example 16 includes the method of any of Examples 14 or 15, wherein depositing the getter material at a second angle includes depositing the getter material such that the getter material extends over top of the evaporable metal material.

Example 17 includes an on-chip alkali dispenser comprising: a monolithic semiconductor substrate defining a trench therein; an electrically conductive material disposed in the trench, the electrically conductive material configured to generate heat via electrical current propagating therethrough; an insulating layer on top of the electrically conductive material; an evaporable metal material disposed in the trench, on top of the insulating layer; and a getter material disposed at least partially in the trench and overtop of the evaporable metal material.

Example 18 includes the dispenser of Example 17, wherein the getter material comprises a powder; and wherein the alkali dispenser comprises a permeable membrane over the getter material, enclosing the getter material within the trench.

Example 19 includes the dispenser of any of Examples 17 or 18, wherein the getter material comprises a patterned thin film having a plurality of passages to allow gas from the evaporable metal material to permeate the getter material.

Example 20 includes the dispenser of any of Examples 17-19, wherein the getter material is disposed adjacent to the evaporable metal material on a side surface of the trench.

What is claimed is:

1. An on-chip alkali dispenser comprising:
   a monolithic semiconductor substrate defining a trench therein;
   an evaporable metal material disposed in the trench;
   a heating element disposed proximate the evaporable metal material and configured to provide heat to the evaporable metal material; and
   a getter material disposed to sorb unwanted materials released from the evaporable metal material.

2. The on-chip alkali dispenser of claim 1, wherein the heating element is disposed one of in the trench under the evaporable metal material or on backside of the semiconductor substrate proximate the trench.

3. The on-chip alkali dispenser of claim 1, wherein the getter material is disposed within the trench and overtop of the evaporable metal material, wherein the getter material comprises a powder; and
   wherein the alkali dispenser comprises a permeable membrane over the getter material, enclosing the getter material within the trench.

4. The on-chip alkali dispenser of claim 1, wherein the getter material is disposed within the trench and overtop of the evaporable metal material, wherein the getter material comprises a porous thin film.

5. The on-chip alkali dispenser of claim 1, wherein the getter material is disposed within the trench and overtop of the evaporable metal material, wherein the getter material comprises a patterned thin film having a plurality of passages to allow gas from the evaporable metal material to permeate the getter material.

6. The on-chip alkali dispenser of claim 1, wherein the heating element is disposed in the trench, wherein the alkali dispenser comprises:
   an electrically insulating layer disposed on top of the heating element; and
   wherein the evaporable metal material is disposed on top of the electrically insulating layer.

7. The on-chip alkali dispenser of claim 1, wherein the getter material is disposed adjacent to the evaporable metal material on a side surface of the trench.

8. The on-chip alkali dispenser of claim 1, wherein the heating element is coupled to an electrical source and configured to heat by converting electrical current into heat.

9. The on-chip alkali dispenser of claim 1, wherein the heating element is coupled to a radio frequency tuned circuit and configured to heat by having electrical currents induced therein from a radio frequency signal.

10. The dispenser of claim 1, wherein the evaporative metal material comprises a material configured to release an alkali metal upon heating.

11. The dispenser of claim 1, wherein the evaporative metal material comprises a material configured to release an alkaline-earth metal upon heating.

12. An on-chip alkali dispenser comprising:
    a monolithic semiconductor substrate defining a trench therein;
    an electrically conductive material disposed in the trench, the electrically conductive material configured to generate heat via electrical current propagating therethrough;
    an electrically insulating layer on top of the electrically conductive material;
    an evaporable metal material disposed in the trench, on top of the electrically insulating layer; and
    a getter material disposed at least partially in the trench and overtop of the evaporable metal material.

13. The dispenser of claim 12, wherein the getter material comprises a powder; and
    wherein the alkali dispenser comprises a permeable membrane over the getter material, enclosing the getter material within the trench.

14. The dispenser of claim 12, wherein the getter material comprises a patterned thin film having a plurality of passages to allow gas from the evaporable metal material to permeate the getter material.

15. The dispenser of claim 12, wherein the getter material is disposed adjacent to the evaporable metal material on a side surface of the trench.

16. The dispenser of claim 12, wherein the evaporative metal material comprises a material configured to release an alkali metal upon heating.

17. The dispenser of claim 12, wherein the evaporative metal material comprises a material configured to release an alkaline-earth metal upon heating.

* * * * *